(12) United States Patent
Park et al.

(10) Patent No.: US 7,547,574 B2
(45) Date of Patent: Jun. 16, 2009

(54) ORGANIC THIN FILM TRANSISTOR(S) AND METHOD(S) FOR FABRICATING THE SAME

(75) Inventors: Hyun Jung Park, Seoul (KR); Sang Yoon Lee, Seoul (KR); Eun Jeong Jeong, Seongnam-si (KR); Kook Min Han, Suwon-si (KR); Jung Seok Hahn, Seongnam-si (KR); Tae Woo Lee, Seoul (KR)

(73) Assignee: Samsung Electronics, Co., Ltd., Gyeonggi-Do (KR)

( * ) Notice: Subject to any disclaimer, the term of this patent is extended or adjusted under 35 U.S.C. 154(b) by 348 days.

(21) Appl. No.: 11/297,396

(22) Filed: Dec. 9, 2005

(65) Prior Publication Data

US 2006/0289858 A1 Dec. 28, 2006

(30) Foreign Application Priority Data

Jun. 28, 2005 (KR) .................. 10-2005-0056196

(51) Int. Cl.
*H01L 51/40* (2006.01)
(52) U.S. Cl. .................. 438/99; 438/151; 257/40; 257/66
(58) Field of Classification Search .................. 438/99, 438/151; 257/40, 66
See application file for complete search history.

(56) References Cited

U.S. PATENT DOCUMENTS

| 6,108,419 | A | 8/2000 | LaMacchia et al. | |
| 6,278,783 | B1 | 8/2001 | Kocher et al. | |
| 6,413,587 | B1 * | 7/2002 | Hawker et al. | 427/264 |
| 7,081,641 | B2 * | 7/2006 | Kawasaki et al. | 257/40 |
| 7,132,678 | B2 * | 11/2006 | Kagan et al. | 357/40 |
| 7,329,319 | B2 * | 2/2008 | Myerson et al. | 117/68 |
| 2004/0112279 | A1 * | 6/2004 | Aizenberg | 117/54 |
| 2004/0161873 | A1 | 8/2004 | Dimitrakopoulos et al. | |

FOREIGN PATENT DOCUMENTS

EP 1 137 322 B1 3/2000

* cited by examiner

*Primary Examiner*—Matthew Smith
*Assistant Examiner*—Colleen E Rodgers
(74) *Attorney, Agent, or Firm*—Harness, Dickey & Pierce P.L.C.

(57) ABSTRACT

Example embodiments of the present invention for fabricating an organic thin film transistor including a substrate, a gate electrode, a gate insulating layer, metal oxide source/drain electrodes and an organic semiconductor layer wherein the metal oxide source/drain electrodes are surface-treated with a self-assembled monolayer (SAM) forming compound containing a sulfonic acid group. According to example embodiments of the present invention, the surface of the source/drain electrodes may be modified to be more hydrophobic and/or the work function of a metal oxide constituting the source/drain electrodes may be increased to above that of an organic semiconductor material constituting the organic semiconductor layer. Organic thin film transistors fabricated according to one or more example embodiments of the present invention may exhibit higher charge carrier mobility. Also disclosed are various example devices including display devices having organic thin film transistors made by example embodiments of the present invention.

26 Claims, 2 Drawing Sheets

ORGANIC THIN FILM TRANSISTOR(S) AND METHOD(S) FOR FABRICATING THE SAME

PRIORITY STATEMENT

This non-provisional application claims priority under 35 U.S.C. § 119 of Korean Patent Application No. 2005-56196 filed on Jun. 28, 2005, the entire contents of which are incorporated herein by reference.

BACKGROUND OF THE INVENTION

1. Field of the Invention

Example embodiments of the present invention relate to an organic thin film transistor and to a method for fabricating the same. More particularly, example embodiments of the present invention relate to a method for fabricating an organic thin film transistor with improved (e.g., higher) charge carrier mobility. According to example embodiments of the present invention, the organic thin film transistor may include a substrate, a gate electrode, a gate insulating film, metal oxide source/drain electrodes and an organic semiconductor layer. In example embodiments of the present invention, the metal oxide source/drain electrodes may be surface-treated with a self-assembled monolayer (SAM) forming compound containing a sulfonic acid group so that the hydrophobic quality, charge carrier mobility and/or work function of a metal oxide constituting the source/drain electrodes may be increased.

2. Description of the Related Art

With the advent of polyacetylenes as conjugated organic polymers exhibiting semiconductor characteristics, organic semiconductors have been investigated as electrical and electronic materials in a wide variety of applications, e.g., functional electronic and optical devices. Because organic semiconductors may lend themselves to various synthetic processes, may be easier to mold into fibers and films, and may exhibit superior flexibility, higher conductivity organic semiconductors may provide a way to lower manufacturing costs.

Organic thin film transistors may have advantages in that semiconductor layers may be formed by printing processes at ambient pressure instead of being formed by conventional silicon processes such as plasma-enhanced chemical vapor deposition (CVD). Also, if needed, the overall fabrication procedure may be achieved by roll-to-roll processes using plastic substrates, which may be economically advantageous over silicon thin film transistors. Among other possible uses, thin film transistors may be integrated into active displays and plastic chips (or other suitable chip material) for use in smart cards and inventory tags.

Nevertheless, organic thin film transistors may suffer from having a low charge carrier mobility, high driving voltage and/or high threshold voltage in comparison with silicon thin film transistors. But organic thin film transistors having a charge carrier mobility of about 0.6 $cm^2 \cdot V^{-1} \cdot sec^{-1}$ using, for example, pentacene in an organic thin film transistor may still be put to practical use. The charge carrier mobility of the organic thin film transistor, however, may still be unsatisfactory. Further, there may be some disadvantages of organic thin film transistors because they may require a driving voltage of about 100 V or more and a threshold voltage of about 50 times higher than that required of silicon thin film transistors.

Sometimes when pentacene is used as the organic semiconductor material in a bottom-contact or top-gate organic thin film transistor, the pentacene is prone to deposit on a gate insulating layer rather than on source/drain electrodes and may have a relatively high work function compared to metal source/drain electrodes. Consequently, a Schottky barrier may be formed between the source/drain electrodes and the organic semiconductor layer, which may lower the charge carrier mobility of the organic thin film transistor.

According to a conventional process, organic thin film transistors may be produced by first treating the exposed surface of source/drain electrodes with a self-assembled monolayer compound containing a thiol functional group before deposition of an organic semiconductor layer. However, the monolayer compound may become bound to metal surfaces, e.g., gold (Au), while remaining unbound to the surface of metal oxides, e.g., indium-tin oxide. Thus, formation of improved thin film transistors comprising metal oxide source/drain electrodes and an organic semiconductor layer by such monolayer process has proved to be somewhat difficult.

SUMMARY

An example embodiment of the present invention provides a method of fabricating an organic thin film transistor with one or more improved electrical properties. For example, higher charge carrier mobility may be achieved by treating the surface of metal oxide source/drain electrodes with a self-assembled monolayer forming compound containing a sulfonic acid group ($-SO_3H$). The ($-SO_3H$) group is capable of strongly adsorbing on the metal oxide of the source/drain electrodes so that the metal oxide may have a higher work function than an ordinary organic semiconductor material.

In accordance with an example embodiment of the present invention, there is provided a method for fabricating an organic thin film transistor including a substrate, a gate electrode, a gate insulating film, metal oxide source/drain electrodes and an organic semiconductor layer wherein the metal oxide source/drain electrodes may be surface-treated (or coated) with a self-assembled monolayer (SAM) forming compound containing, for example, a sulfonic acid group.

In accordance with another example embodiment of the present invention, an organic thin film transistor may be fabricated by the above noted method.

In accordance with yet another example embodiment of the present invention, a display device using the above-noted (SAM with sulfonic acid group coating) organic thin film transistor may be made.

BRIEF DESCRIPTION OF THE DRAWINGS

Example embodiments the present invention may be more clearly understood from the following non-limiting detailed description taken in conjunction with the accompanying drawings.

FIG. 1 is a cross-sectional view schematically showing the structure of an organic thin film transistor fabricated in accordance with an example embodiment of the present invention; and FIG. 2 is a graph showing the current transfer characteristics of organic thin film transistors fabricated pursuant to non-limiting Examples 1 to 4 of the present invention and pursuant to Comparative Examples 1 to 4.

DESCRIPTION OF EXAMPLE EMBODIMENTS OF THE INVENTION

Figure 1:
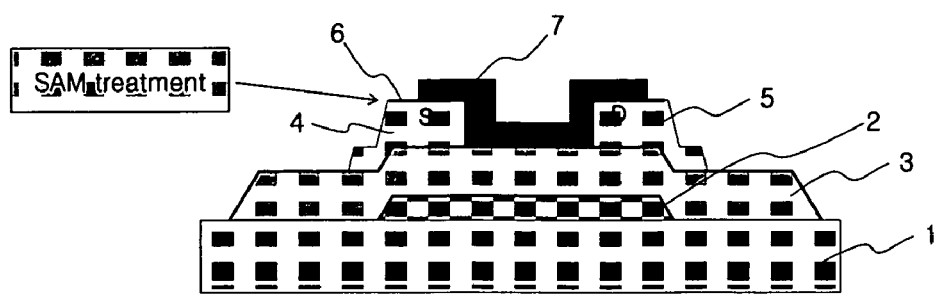
FIGS. 1-2 represent non-limiting examples, embodiments and/or intermediates of the present invention as described herein.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed. To the contrary, example embodiments of the invention are also intended to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

An example embodiment of the present invention provides a method for fabricating an organic thin film transistor including a substrate, a gate electrode, a gate insulating film, metal oxide source/drain electrodes and an organic semiconductor layer wherein the metal oxide source/drain electrodes are surface-treated with a self-assembled monolayer forming compound containing, for example, a sulfonic acid group.

Non-limiting examples of organic thin film transistors that may be fabricated (by one or more example embodiment methods of the present invention) include (but are not limited to) bottom-contact organic thin film transistors with a bottom-gate and top-gate organic thin film transistors. According to an example embodiment of the present invention, bottom-contact organic thin film transistors may be fabricated by, for example, a method including: forming a gate electrode on a substrate; forming a gate insulating film thereon; forming metal oxide source/drain electrodes on the gate insulating film; forming a self-assembled monolayer on the surface of the metal oxide source/drain electrodes; and forming an organic semiconductor layer on the gate insulating film and the self-assembled monolayer. According to another example embodiment of the present invention, top-gate organic thin film transistors may be fabricated, for example, by a method including: forming metal oxide source/drain electrodes on a substrate; forming a self-assembled monolayer on the surface of the metal oxide source/drain electrodes; forming an organic semiconductor layer between the metal oxide source and drain electrodes; forming an insulating film thereon; and forming a gate electrode on the insulating film.

Example embodiments of the present invention are described in the context of fabrication of a bottom-contact organic thin film transistor. However, example embodiments of the present invention may also be applied to the fabrication of a top-gate organic thin film transistor. An example embodiment of the present invention (e.g., for fabricating a bottom-contact organic thin film transistor) may include:

optionally washing a substrate to remove impurities by common techniques, and forming a gate electrode on the substrate by, for example, deposition such as pattern deposition.

The substrate may be made of, without limitation, glass, silicon, plastic, etc. Other suitable substrate materials may be used.

As a suitable material for the gate electrode, a metal or an electrically conductive polymer may be used. Specific examples of gate electrode materials include, but are not limited to, gold (Au), silver (Ag), aluminum (Al), nickel (Ni), molybdenum (Mo), tungsten (W), indium-tin oxides (ITO), polythiophenes, polyanilines, polyacetylenes, polypyrroles, polyphenylene vinylenes, and polyethylenedioxythiophene (PEDOT)/polystyrenesulfonate (PSS) mixtures. Other suitable gate electrode materials may be used.

After forming the gate electrode(s) on the substrate, a gate insulating layer may be formed thereon by common techniques.

Examples of suitable materials for the gate insulating layer used in conjunction with organic thin film transistors made according to example embodiments of the present invention include, but are not limited to, organic materials, such as polyolefins, polyvinyls, polyacrylates, polystyrenes, polyurethanes, polyimides, polyvinylphenols and derivatives thereof, and inorganic materials, such as $SiN_x$ (0<x<4), $SiO_2$ and $Al_2O_3$. If needed, the thickness of the gate insulating layer may be appropriately controlled by known processes.

According to another example embodiment of the present invention, a gate insulator containing a crosslinking agent or an organic-inorganic hybrid insulator may be used. The gate insulating layer may have a thickness from about 3,000 Å to about 7,000 Å (e.g., 3,500; 4,000; 4,500; 5,000; 5,500; 6,000; or 6,500 Å).

Pursuant to an example embodiment of the present invention, the gate insulating layer may be formed by, for example, vacuum deposition and/or solution processing. Other suitable methods for forming the gate insulating layer may be used.

If necessary, the gate insulating layer may be soft-baked at a temperature from about 60° C. to about 150° C. for a time from about 1 to about 10 minutes. Or, according to another example embodiment of the present invention, the gate insulating layer may be hard-baked for a temperature from about 100° C. to about 200° C. for a time from about 30 minutes to about 3 hours.

Source and drain electrodes may be formed on the gate insulating layer.

Specifically, a metal oxide may be coated on the gate insulating layer by common thin film formation techniques to form a metal oxide thin film. Thereafter, the source and drain electrodes may be formed by photolithography. In particular, the metal oxide thin film may be developed by exposing selected areas (using a photoresist) where source and drain electrodes are to be formed (or areas other than the source and drain electrodes) to light. Etching may then be carried out using acetonitrile, etc., by common techniques. The photoresist may then be removed using a photoresist stripper to form metal oxide source/drain electrodes on the gate insulating layer.

Examples of suitable metal oxides as materials for the source and drain electrodes of an organic thin film transistor made according to an example embodiment of the present invention include, but are not limited to, indium-tin oxide (ITO) and indium-zinc oxide (IZO).

Deposition of the metal oxide on the gate insulating film may be performed by, without limitation, thermal evaporation, spin coating, roll coating, spray coating, printing, and the like. Other suitable processes for forming a thin film of metal oxide on the gate insulating layer may be used.

The metal oxide source/drain electrodes may be surface-treated with a self-assembled monolayer forming compound containing a sulfonic acid group under suitable conditions.

The self-assembled monolayer forming compound which may be used for the surface treatment may be characterized by the presence of a sulfonic acid group ($-SO_3H$).

The sulfonic acid group acts as an adsorbing group on the surface of, for example, the metal oxide source/drain electrodes. Also, the $H^+$ of the sulfonic acid group has a strong tendency to dissociate. In other words, the group ($-SO_3H$) readily loses its $H^+$ to the metal oxide layer to yield a $SO_3^-$ group which is then more easily adsorbed to the metal oxide surface.

Examples of self-assembled monolayer forming compounds containing a sulfonic acid group that may be used in example embodiments of the present invention include, but are not limited to, compounds of Formulae 1 to 3 below:

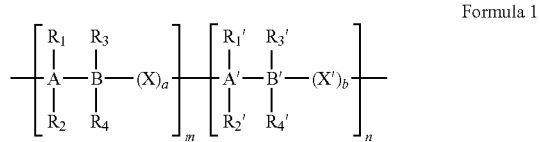

Formula 1 wherein m, n, a and b are integers satisfying the relations $0<m \leq 10,000$, $0 \leq n < 10,000$, $0 \leq a \leq 20$, and $0 \leq b \leq 20$, respectively, A, B, A' and B' are each independently selected from the group consisting of C, Si, Ge, Sn, and Pb, $R_1$, $R_2$, $R_3$, $R_4$, $R_1'$, $R_2'$, $R_3'$ and $R_4'$ are each independently selected from the group consisting of hydrogen, halogens, nitro groups, substituted and unsubstituted amino groups, cyano groups, substituted and unsubstituted $C_1$-$C_{30}$ alkyl groups, substituted and unsubstituted $C_1$-$C_{30}$ heteroalkyl groups, substituted and unsubstituted $C_1$-$C_{30}$ alkoxy groups, substituted and unsubstituted $C_1$-$C_{30}$ heteroalkoxy groups, substituted and unsubstituted $C_6$-$C_{30}$ aryl groups, substituted and unsubstituted $C_6$-$C_{30}$ arylalkyl groups, substituted and unsubstituted $C_6$-$C_{30}$ aryloxy groups, substituted and unsubstituted $C_2$-$C_{30}$ heteroaryl groups, substituted and unsubstituted $C_2$-$C_{30}$ heteroarylalkyl groups, substituted and unsubstituted $C_2$-$C_{30}$ heteroaryloxy groups, substituted and unsubstituted $C_5$-$C_{20}$ cycloalkyl groups, substituted and unsubstituted $C_2$-$C_{30}$ heterocycloalkyl groups, substituted and unsubstituted $C_1$-$C_{30}$ alkylester groups, substituted and unsubstituted $C_1$-$C_{30}$ heteroalkylester groups, substituted and unsubstituted $C_6$-$C_{30}$ arylester groups, and substituted and unsubstituted $C_2$-$C_{30}$ heteroarylester groups, with the proviso that at least one of $R_1$, $R_2$, $R_3$ and $R_4$ contains a sulfonic acid group, and X and X' are each independently selected from the group consisting of a single bond, O, N, S, substituted and unsubstituted $C_1$-$C_{30}$ alkylene groups, substituted and unsubstituted $C_1$-$C_{30}$ heteroalkylene groups, substituted and unsubstituted $C_6$-$C_{30}$ arylene groups, substituted and unsubstituted $C_6$-$C_{30}$ arylalkylene groups, substituted and unsubstituted $C_2$-$C_{30}$ heteroarylene groups, substituted and unsubstituted $C_2$-$C_{30}$ heteroarylalkylene groups, substituted and unsubstituted $C_5$-$C_{20}$ cycloalkylene groups, substituted and unsubstituted $C_5$-$C_{30}$ heterocycloalkylene groups, substituted and unsubstituted C6-C30 arylester groups, and substituted and unsubstituted $C_2$-$C_{30}$ heteroarylester groups;

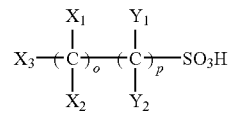

Formula 2 wherein o is an integer from 1 to about 10,000, and p is an integer from 0 to about 10,000, and $X_1$, $X_2$, $X_3$, $Y_1$ and $Y_2$ are each independently hydrogen, fluorine, a $C_6$-$C_{30}$ aromatic group, or a $C_5$-$C_{30}$ heteroaromatic group interrupted by at least one hetero atom in which the aromatic and heteroaromatic groups may be substituted with at least one group selected from $C_1$-$C_{12}$ alkyl groups, alkoxy groups, ester groups, carboxylic groups, thiol groups and amine groups;

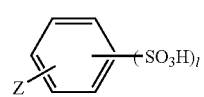

Formula 3 wherein l is an integer from 1 to about 5, and

Z is hydrogen, fluorine, a $C_6$-$C_{30}$ aromatic group, or a $C_5$-$C_{30}$ heteroaromatic group in which the aromatic and heteroaromatic groups may be substituted with at least one group selected from $C_1$-$C_{12}$ alkyl groups, alkoxy groups, ester groups, carboxylic groups, thiol groups and amine groups.

Specific examples of the substituent "alkyl group" as used herein include linear and branched methyl, ethyl, propyl, isobutyl, sec-butyl, tert-butyl, pentyl, iso-amyl, hexyl, and the like. At least one hydrogen atom included in the alkyl group may be substituted with a halogen atom, a hydroxyl group, a nitro group, a cyano group, an amino group (—$NH_2$, —NH(R) or —N(R')(R"), where R' and R" are each independently a $C_1$-$C_{10}$ alkyl group), an amidino group, a hydrazine group, or a hydrazone group.

The substituent "heteroalkyl group" as used herein refers to an alkyl group in which one or more carbon atoms, for example, one to five carbon atoms, in the main alkyl chain are substituted with at least one hetero atom, e.g., oxygen, sulfur, nitrogen and phosphorous atoms.

The substituent "aryl group" as used herein refers to a carbocyclic aromatic system including at least one aromatic ring in which the rings are bonded or fused together in a pendant manner. Specific non-limiting examples of the aryl group include aromatic groups, e.g., phenyl, naphthyl, and tetrahydronaphthyl. At least one hydrogen atom included in the aryl group may be substituted with the same substituent as defined with respect to the substituent "alkyl group."

The substituent "heteroaryl group" as used herein refers to a $C_5$-$C_{30}$ cyclic aromatic system in which one to three hetero atoms selected from N, O, P and S are included, the remaining ring atoms are carbon, and the rings are bonded or fused together in a pendant manner. At least one hydrogen atom included in the heteroaryl group may be substituted with the same substituent as defined with respect to the substituent "alkyl group."

The substituent "alkoxy group" as used herein represents alkyl-O-radical where alkyl is as defined above. Specific non-limiting examples of the alkoxy group include methoxy, ethoxy, propoxy, isobutyloxy, sec-butyloxy, pentyloxy, iso-amyloxy, and hexyloxy. At least one hydrogen atom included in the alkoxy group may be substituted with the same substituent as defined with respect to the substituent "alkyl group."

The substituent "heteroalkoxy group" as used herein has substantially the same meaning as the substituent "alkoxy group," except that at least one hetero atom, for example, oxygen, sulfur or nitrogen, is present in the alkyl chain. As non-limiting examples of heteroalkoxy groups, there may be mentioned $CH_3CH_2OCH_2CH_2O$—, $C_4H_9OCH_2CH_2OCH_2CH_2O$— and $CH_3O(CH_2CH_2O)_nH$.

The substituent "arylalkyl group" as used herein refers to a substituent in which hydrogen atoms included in the aryl group defined above are partly substituted with lower alkyl groups, such as methyl, ethyl and propyl. Non-limiting examples of the arylalkyl group include benzyl and phenylethyl. At least one hydrogen atom included in the arylalkyl group may be substituted with the same substituent as defined with respect to the substituent "alkyl group."

The substituent "heteroarylalkyl group" as used herein refers to a substituent in which hydrogen atoms included in the heteroaryl group defined above are partly substituted with lower alkyl groups, such as methyl, ethyl and propyl. Non-limiting examples of the arylalkyl group include benzyl and phenylethyl. At least one hydrogen atom included in the heteroarylalkyl group may be substituted with the same substituent as defined with respect to the substituent "alkyl group."

The substituent "aryloxy group" as used herein represents an aryl-O-radical wherein aryl is as defined above. Specific non-limiting examples of the aryloxy group include phenoxy, naphthoxy, anthracenyloxy, phenanthrenyloxy, fluorenyloxy, and indenyloxy. At least one hydrogen atom included in the aryloxy group may be substituted with the same substituent as defined with respect to the substituent "alkyl group."

The substituent "heteroaryloxy group" as used herein represents a heteroaryl-O-radical wherein heteroaryl is as defined above. Specific non-limiting examples of the heteroaryloxy group include benzyloxy and phenylethyloxy groups. At least one hydrogen atom included in the heteroaryloxy group may be substituted with the same substituent as defined with respect to the substituent "alkyl group."

The substituent "cycloalkyl group" as used herein refers to a monovalent monocyclic system having from about 5 to about 30 carbon atoms. At least one hydrogen atom included in the cycloalkyl group may be substituted with the same substituent as defined with respect to the substituent "alkyl group."

The substituent "heterocycloalkyl group" as used herein refers to a $C_5$-$C_{30}$ monovalent monocyclic system in which one to three hetero atoms selected from N, O, P and S are included, and the remaining ring atoms are carbon. At least one hydrogen atom included in the heterocycloalkyl group may be substituted with the same substituent as defined with respect to the substituent "alkyl group."

The substituent "alkylester group" as used herein refers to a functional group in which an alkyl group is bonded to an ester group. The alkyl group is as defined above.

The substituent "heteroalkylester group" as used herein refers to a functional group in which a heteroalkyl group is bonded to an ester group. The heteroalkyl group is as defined above.

The substituent "arylester group" as used herein refers to a functional group in which an aryl group is bonded to an ester group. The aryl group is as defined above.

The substituent "heteroarylester group" as used herein refers to a functional group in which a heteroaryl group is bonded to an ester group. The heteroaryl group is as defined above.

The substituent "amino group" as used herein refers to —$NH_2$, —NH(R) or —N(R')(R") where R' and R" are each independently a $C_1$-$C_{10}$ alkyl group.

At least one hydrogen atom included in the above-mentioned substituents may be substituted with a halogen atom. According to an example embodiment of the present invention, the halogen atom maybe a fluorine atom.

According to an example embodiment of the present invention, the self-assembled monolayer forming compounds containing a sulfonic acid group, represented by Formulae 1 to 3, may contain a fluorine atom.

In an example embodiment of the present invention, when the metal oxide source/drain electrodes are surface-treated with the self-assembled monolayer forming compound containing a fluorine atom, the fluorine atom acts as an electron acceptor to attract electrons from an organic semiconductor material which may constitute the organic semiconductor layer, causing hole-doping effects. As a result, according to an example embodiment of the present invention, the metal oxide constituting the source/drain electrodes may have a higher work function, hydrophobic quality and/or charge carrier mobility than that of the organic semiconductor material itself.

Among self-assembled monolayer forming compounds containing a sulfonic acid group that can be represented by Formula 1, non-limiting examples of compounds containing a fluorine atom can be represented by the following Formulae 4 to 7:

Formula 4

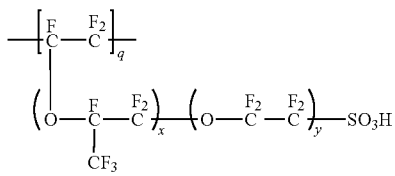

wherein q is an integer of from 1 to about 10,000, and x and y are each independently an integer of from 0 to about 10;

Formula 5

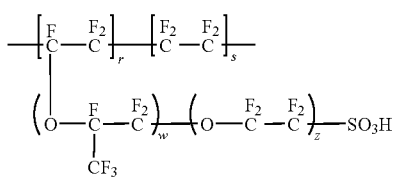

wherein r and s are integers satisfying the relations $0 < r \leq 10{,}000$ and $0 \leq s < 10{,}000$, respectively, and w and z are each independently an integer of from 0 to about 20;

Formula 6

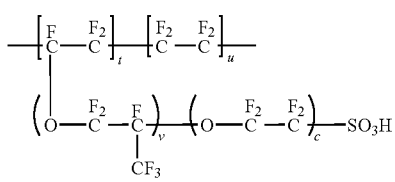

wherein t and u are integers satisfying the relations $0 < t \leq 10{,}000$ and $0 \leq u < 10{,}000$, respectively, and v and c are each independently an integer of from 0 to about 20;

Formula 7

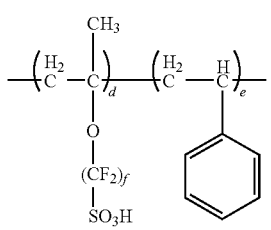

wherein d and e are integers satisfying the relations $0 < d \leq 10{,}000$ and $0 \leq e < 10{,}000$, respectively, and wherein f is an integer from 0 to about 20.

According to an example embodiment of the present invention, among self-assembled monolayer forming compounds containing a sulfonic acid group that may be represented by Formula 2, compounds containing a fluorine atom include, but are not limited to, $CF_3(CF_2)_jSO_3H$, $CF_3(CH_2)_jSO_3H$, $CF_3(CF_2)_j(CH_2)_kSO_3H$, and $CH_3(CF_2)_j(CH_2)_kSO_3H$ (where j and k are each independently an integer of from 1 to about 20).

Pursuant to another example embodiment of the present invention, among self-assembled monolayer forming compounds that may be represented by Formula 3, compounds containing a fluorine atom can be represented, without limitation, by either of the following Formulae 8 and 9:

Formula 8

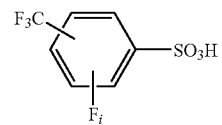

wherein i is an integer of from 1 to about 4;

Formula 9

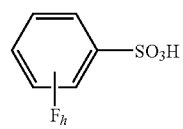

wherein h is an integer of from 1 to about 5.

In accordance with another example embodiment of the present invention, the self-assembled monolayer forming compounds (used in the various example embodiments of the present invention) may have a preference for binding to the surface of the metal oxide as compared to binding to the surface of the gate insulating layer. Thus, in accordance with an example embodiment of the present invention, when the gate insulating layer on which the metal oxide source/drain electrodes are formed is surface-treated with the self-assembled monolayer forming compounds, these compounds are strongly (and selectively, or substantially selectively) bound to the surface of the metal oxide source/drain electrodes, so that the current transfer characteristics (e.g., charge carrier mobility), hydrophobic quality and/or work function of the source/drain electrodes may be improved.

According to an example embodiment of the present invention, the surface treatment of the metal oxide source/drain electrodes with the self-assembled monolayer compound containing a sulfonic acid group may be performed using a solution of the self-assembled monolayer forming compound in a solvent selected from the group consisting of water, organic solvents and mixtures thereof. Other suitable solvents may be used. More specifically, in an example embodiment of the present invention, the formation of a self-assembled monolayer may be performed by impregnating the surface of the metal oxide source/drain electrodes with the self-assembled monolayer forming solution at a particular temperature for a particular period of time.

In accordance with an example embodiment of the present invention, a solvent used to prepare the self-assembled monolayer forming solution is selected from the group consisting of water, organic solvents and mixtures thereof. For example, the solvent may be a mixed solvent of water and at least one organic solvent.

Examples of suitable organic solvents that can be used in example embodiments of the present invention include, but are not limited to: alcohols, such as ethanol; ethers; chlorinated alkanes; aromatic solvents; and glycols.

According to another example embodiment of the present invention, the self-assembled monolayer forming solution (used in an example embodiment of the method of the present invention) may contain from about 0.001 to about 20 wt % of the self-assembled monolayer forming compound containing a sulfonic acid group, based on a total weight of the solution.

According to another example embodiment of the present invention, the surface treatment of the metal oxide source/drain electrodes with the self-assembled monolayer forming solution may be performed at a temperature from about 10 to about 150° C. (e.g., 15, 20, 25, 30, 35, 40, 45, 50, 60, 70, 80, 90, 100, 110, 120, 130, or 140° C.) for a time from about 10 minutes to about one hour.

An organic semiconductor material may be deposited on the self-assembled monolayer and the gate insulating layer by common coating techniques to form an organic semiconductor layer.

According to another example embodiment of the present invention, examples of materials suitable for the organic semiconductor layer of the organic thin film transistor include, but are not limited to, pentacenes, tetracenes, copper phthalocyanines, polythiophenes, polyanilines, polyacetylenes, polypyrroles, polyphenylene vinylenes, and derivatives thereof. Other suitable organic semiconductor layer materials may be used. Depositing a coating of the organic semiconductor material may be carried out by thermal evaporation, screen printing, printing, spin coating, dip coating, or ink spraying. Other suitable coating processes may be used.

A method according to an example embodiment of the present invention may further include acid-treating or UV-ozonating the surface of the source/drain electrodes, prior to surface treatment of the source/drain electrodes with the self-assembled monolayer forming compound containing a sulfonic acid group.

Such acid treatment or UV ozonation before the application and formation of the self-assembled monolayer on the surface of the source/drain electrodes may render the surface of the metal oxide more hydrophilic, which may increase the adsorption of the sulfonic acid group to the metal oxide surface.

According to another example embodiment of the present invention, the acid treatment may be performed by impregnating the surface of the metal oxide source/drain electrodes with an organic or inorganic acid solution at a temperature from about 15 to about 35° C. for a time from about 0.5 to about 10 seconds.

An example of organic acid that may be used in an example embodiment of the present invention may be represented by Formula 10 below:

    Formula 10 wherein R is a $C_{1-12}$ alkyl, alkenyl or alkynyl group; a $C_{3-30}$ cycloalkyl group; a $C_{6-30}$ aryl group; or a fluoro-substituted functional group.

Specific examples of inorganic acids that may be used in accordance with an example embodiment of the present invention include, but are not limited to, HI HBr, HCl, HF, $HNO_3$, $H_3PO4$, $H_2SO_4$, and mixtures thereof. Mixed acids may also be used according to another example embodiment of the present invention. For example, HCl and $HNO_3$ may be used as a mixed acid for etching, for example, ITO source/drain electrodes.

Also, the UV ozonation may be performed by irradiating the surface of the metal oxide source/drain electrodes using a lamp having a power of about 0.28 W/cm$^3$ at a wavelength of about 254 nm for a time from about 1 to about 30 minutes.

A method for fabricating an organic thin film transistor according to an example embodiment of the present invention may further include annealing the source/drain electrodes surface treated with the self-assembled monolayer forming compound.

This annealing may increase the adhesion of the self-assembled monolayer to the source/drain electrodes, enabling the fabrication of transistors having a higher charge carrier mobility than that of transistors fabricated without annealing.

According to an example embodiment of the present invention, the annealing may be performed at a temperature from about 50 to about 200° C. (e.g., 60, 70, 80, 90, 100, 110, 120, 130, 140, 150, 160, 170, 180, or 190° C., respectively) for a time from about 10 minutes to about one hour.

A method for producing an organic thin film transistor according to another example embodiment of the present invention may further include acid-treating or UV-ozonating the surface of the metal oxide source/drain electrodes, prior to the surface treatment with the self-assembled monolayer forming compound containing a sulfonic acid group, and annealing the surface-treated the metal oxide source/drain electrodes.

Pursuant to an example embodiment of the present invention, an organic thin film transistor fabricated by a method (in accordance with a further example embodiment) of the present invention may have a bottom-contact structure. The structure of such a bottom-contact organic thin film transistor may be as shown in FIG. 1. As shown in the example embodiment of the present invention of FIG. 1, the bottom-contact organic thin film transistor may have a structure including a substrate 1, a gate electrode 2, a gate insulating film 3, metal oxide source/drain electrodes 4 and 5, a self-assembled monolayer 6, and/or an organic semiconductor layer 7.

According to another example embodiment of the present invention, the surface of the source/drain electrodes of the organic thin film transistor may be changed to be more hydrophobic. By doing so, the metal oxide constituting the source/drain electrodes may have a higher work function than the organic semiconductor material. Accordingly, the organic thin film transistor may show superior electrical properties, particularly, a higher charge carrier mobility.

The organic thin film transistor fabricated by an example embodiment of the present invention may be utilized in the manufacture of display devices, such as, for example, electroluminescence devices, liquid crystal devices, and electrophoresis devices.

Additional example embodiments of the present invention will now be described in more detail with reference to the following non-limiting examples. These example embodiments of the present invention are provided for the purpose of illustration and are not to be construed as limiting the scope of the invention.

EXAMPLE 1

Al was deposited on a clean glass substrate by a sputtering technique to form a gate electrode having a thickness of 1,500 Å. Polyvinylphenol containing a crosslinking agent was spin-coated thereon at 1,000 rpm to a thickness of 5,000 Å, and soft-baked at 100° C. for 5 minutes to form a gate insulating layer. ITO was deposited on the insulating layer to a thickness of 1,000 Å by a thermal evaporation method, and was then subjected to photolithography to form an ITO electrode pattern. At this time, the deposition was conducted under a vacuum pressure of 2×10$^{-7}$ torr, a substrate temperature of 50° C. and at a deposition rate of 0.85 Å/sec. Subsequently, the ITO electrode was surface-treated by impregnating it with a self-assembled monolayer forming solution at room temperature for 30 minutes. The self-assembled monolayer forming solution was prepared by dissolving 5 wt % (based on a total weight of the solution) of a perfluorinated resin solution (Nafion®, Aldrich) in a mixed solvent (55 wt % ethanol and 45 wt % water). That is, the self-assembled monolayer forming solution consisted of 5 wt % Nafion and 95% wt % mixed solvent, and the mixed solvent consisted of 55 wt % ethanol and 45 wt % water. The perfluorinated resin used herein is represented by the following Formula 11:

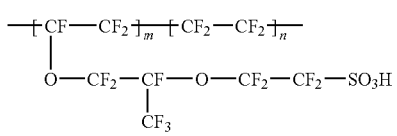

Formula 11 wherein m is an integer of from 5 to 11, and n is 1.

Pentacene was deposited on the self-assembled monolayer and on the insulating layer to a thickness of 1,000 Å by a thermal evaporation method under a vacuum pressure of $2\times10^{-7}$ torr, a substrate temperature of 50° C. and at a deposition rate of 0.85 Å/sec.

EXAMPLE 2

An organic thin film transistor was fabricated in the same manner as in Example 1, except that the surface of the ITO electrode was acid-treated with an ITO etchant (HCl—16.7-20.3% in water) at room temperature for 10 seconds.

EXAMPLE 3

An organic thin film transistor was fabricated in the same manner as in Example 1, except that the surface of the ITO electrode was subjected to UV ozonation using a lamp having a power of 0.28 W/cm$^3$ at a wavelength of 254 nm for 3 minutes, prior to the surface treatment of the ITO electrode.

EXAMPLE 4

An organic thin film transistor was fabricated in the same manner as in Example 1, except that annealing was performed at 200° C. for 30 minutes after the surface treatment of the ITO electrode but before deposition of the pentacene.

EXAMPLE 5

An organic thin film transistor was fabricated in the same manner as in Example 2, except that the acid-treated ITO electrode was surface-treated by impregnating with a self-assembled monolayer forming solution containing 5 wt % (based on a total weight of the solution) of a nonaperfluorosulfonic acid ($C_4F_9SO_3H$) solution in a mixed solvent (55 wt % ethanol and 45 wt % water) at room temperature for 30 minutes, and then a solution of 1 wt % (based on a total weight of the toluene solution) of polythiophene in toluene was applied to a thickness of 1,000 Å. As noted above, the self-assembled monolayer forming solution was composed of 5 wt % nonaperfluorosulfonic acid ($C_4F_9SO_3H$) solution and 95 wt % mixed solvent, and the mixed solvent was composed of 55 wt % ethanol and 45 wt % water.

COMPARATIVE EXAMPLE 1

An organic thin film transistor was fabricated in the same manner as in Example 1, except that the ITO electrode was not surface-treated with a self-assembled monolayer forming compound.

COMPARATIVE EXAMPLE 2

An organic thin film transistor was fabricated in the same manner as in Example 2, except that the ITO electrode was not surface-treated with a self-assembled monolayer forming compound.

COMPARATIVE EXAMPLE 3

An organic thin film transistor was fabricated in the same manner as in Example 3, except that the ITO electrode was not surface-treated with a self-assembled monolayer forming compound.

COMPARATIVE EXAMPLE 4

An organic thin film transistor was fabricated in the same manner as in Example 4, except that the ITO electrode was not surface-treated with a self-assembled monolayer forming compound.

COMPARATIVE EXAMPLE 5

An organic thin film transistor was fabricated in the same manner as in Example 5, except that the ITO electrode was not surface-treated with a self-assembled monolayer forming compound.

The changes in the characteristics of the source/drain electrodes surface-treated with the self-assembled monolayer forming compound and the gate insulating films were evaluated. Specifically, the contact angle between the metal oxide source/drain electrodes and the gate insulating film in each of the organic thin film transistors fabricated in Examples 1 to 4 and Comparative Examples 1 to 4 was determined by advancing angle measurement using a single drop of distilled water. In addition, the work function of the gate insulating films in the organic thin film transistors fabricated in Examples 1 to 4 and Comparative Examples 1 to 4 was determined by photo-electron emission measurement using UV rays. The results obtained are shown in Table 1.

TABLE 1

| Example No. | Contact angle | | Work function (source/drain electrode) |
|---|---|---|---|
| | Source/drain electrode | Gate insulating film | |
| Example 1 | 72.5 | 55.8 | 5.15 |
| Example 2 | 78.5 | 53.1 | 5.56 |
| Example 3 | 80.5 | 49.5 | 5.22 |
| Example 4 | 68.6 | — | — |
| Comparative Example 1 | 54.8 | 60.5 | 5.06 |
| Comparative Example 2 | 31.1 | 53.8 | 4.98 |
| Comparative Example 3 | 28.3 | 53.3 | — |
| Comparative Example 4 | 56.7 | — | — |

As apparent from the results of Table 1 because the self-assembled monolayer forming compound for the surface treatment in example embodiments of the present invention is selectively bound to the surface of the metal oxide source/drain electrodes while not binding (or substantially not binding) to the gate insulating layer, the surface of the source/drain electrodes becomes more hydrophobic, and the work function of the source/drain electrodes is increased, for example, to above that of the organic semiconductor material (pentacene: 5.1 eV).

Figure 2:
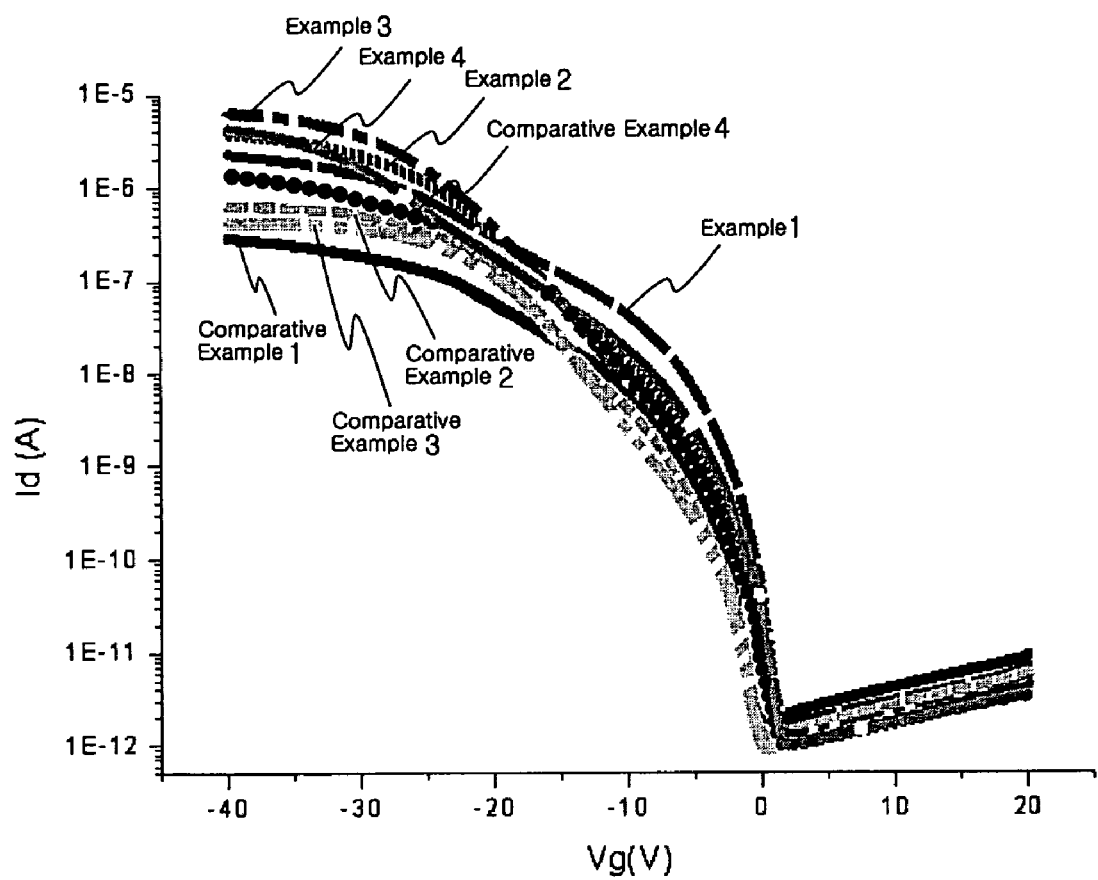

The current transfer characteristics of the organic thin film transistors fabricated in Examples 1-4 and Comparative Examples 1-4 were evaluated using a KEITHLEY semiconductor analyzer (4200-SCS), and the obtained curves were plotted in FIG. 2.

To evaluate the electrical properties of the organic thin film transistors, the charge carrier mobility of the organic thin film transistors fabricated in Examples 1-5 and Comparative Examples 1-5 was calculated from the slope of a graph representing the relationship between $(I_{SD})^{1/2}$ and $V_G$ from the following current equations in the saturation region:

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FET} = (\text{slope})^2 \frac{2L}{C_0 W}$$

In the above equations, ISD=source-drain current, $\mu$ and $\mu_{FET}$=charge carrier mobility, $C_o$=capacitance of the oxide film, W=channel width, L=channel length; $V_G$=gate voltage, and $V_T$=threshold voltage.

TABLE 2

| Example No. | Charge carrier mobility (cm²/Vs) |
|---|---|
| Example 1 | 0.225 |
| Example 2 | 1.00 |
| Example 3 | 0.743 |
| Example 4 | 0.360 |
| Example 5 | 0.085 |
| Comparative Example 1 | 0.035 |
| Comparative Example 2 | 0.183 |
| Comparative Example 3 | 0.173 |
| Comparative Example 4 | 0.085 |
| Comparative Example 5 | 0.029 |

As can be seen from the data shown in Table 2, the organic thin film transistors fabricated by an example embodiment of the present invention show substantially higher charge carrier mobilities in relation to those of Comparative Examples 1-5.

Although example embodiments of the present invention have been disclosed for illustrative purposes, it should be understood that the scope of the present invention is not limited by these example embodiments in any manner and those skilled in the art will appreciate that various modifications are possible without departing from the technical scope and spirit of the invention.

As apparent from the foregoing, according to example embodiments of the present invention, the surface of source/drain electrodes may be changed to be more hydrophobic as well as the work function of a metal oxide constituting the source/drain electrodes may be increased to above that of an organic semiconductor material. Therefore, an example embodiment of the present invention enables the fabrication of organic thin film transistors with higher charge carrier mobility.

What is claimed is:

1. A method for fabricating an organic thin film transistor including a substrate, a gate electrode, a gate insulating layer, metal oxide source/drain electrodes and an organic semiconductor layer, the method comprising:

treating at least one surface of the metal oxide source/drain electrodes with a self-assembled monolayer (SAM) forming compound containing a sulfonic acid group, wherein the self-assembled monolayer forming compound containing a sulfonic acid group is represented by any one of Formulae 4 to 7 below:

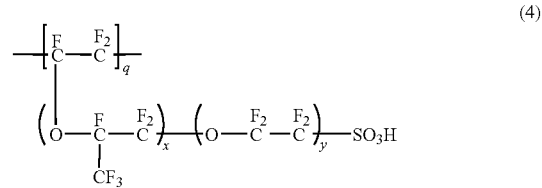

(4)

wherein q is an integer from 1 to about 10,000, and x and y are each independently an integer from 0 to about 10;

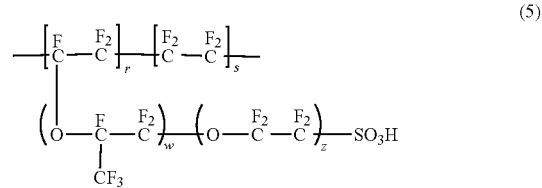

(5)

wherein r and s are integers satisfying the relations 0<r≦10,000 and 0≦s<10,000, respectively, and w and z are each independently an integer from 0 to about 20;

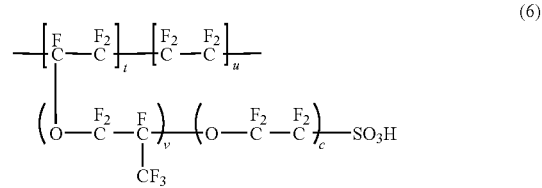

(6)

wherein t and u are integers satisfying the relations 0<t≦10,000 and 0≦u<10,000, respectively, and v and c are each independently an integer of from 0 to about 20;

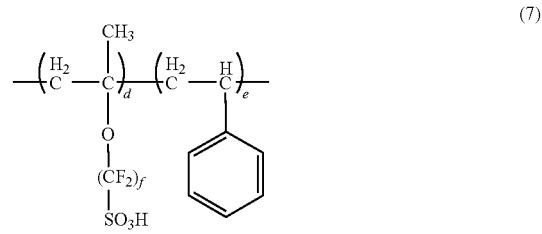

(7)

wherein d and e are integers satisfying the relations 0<d≦10,000 and 0≦e<10,000, respectively, and wherein f is an integer from 0 to about 20.

2. The method according to claim 1, wherein treating at least one surface of the metal oxide source/drain electrodes with a self-assembled monolayer forming compound containing a sulfonic acid group is performed using a solution of the self-assembled monolayer forming compound in a solvent selected from the group consisting of water, organic solvents and mixtures thereof.

3. The method according to claim 2, wherein the solution of the self-assembled monolayer forming compound contains from about 0.001 to about 20 wt % of the self-assembled monolayer forming compound containing a sulfonic acid group based on a total weight of the solution.

4. The method according to claim 2, wherein the organic solvent is selected from the group consisting of an alcohol, ethanol, an ether, a chlorinated alkane, an aromatic solvent, a glycol, and mixtures thereof.

5. The method according to claim 2, wherein treating at least one surface of the metal oxide source/drain electrodes with the self-assembled monolayer forming solution is performed at a temperature from about 10 to about 150° C. for a time from about 10 minutes to about 1 hour.

6. The method according to claim 1, wherein the substrate is made of a material selected from the group consisting of glass, silicon and plastic.

7. The method according to claim 1, wherein the gate electrode is made of a material selected from the group consisting of gold (Au), silver (Ag), aluminum (Al), nickel (Ni), molybdenum (Mo), tungsten (W), indium-tin oxides (ITO), polythiophenes, polyanilines, polyacetylenes, polypyrroles, polyphenylene vinylenes, and polyethylenedioxythiophene (PEDOT)/polystyrenesulfonate (PSS) mixtures.

8. The method according to claim 1, wherein the gate insulating layer is made of a material selected from the group consisting of organic materials, polyolefins, polyvinyls, polyacrylates, polystyrenes, polyurethanes, polyimides, polyvinylphenols and derivatives thereof, and inorganic materials, and $SiN_x$ ($0<x<4$), $SiO_2$ and $Al_2O_3$.

9. The method according to claim 1, wherein the metal oxide source/drain electrodes are made of a material selected from the group consisting of indium-tin oxide (ITO) and indium-zinc oxide (IZO).

10. The method according to claim 1, wherein the organic semiconductor layer is made of a material selected from the group consisting of pentacenes, tetracenes, copper phthalocyanines, polythiophenes, polyanilines, polyacetylenes, polypyrroles, polyphenylene vinylenes, and derivatives thereof.

11. An organic thin film transistor fabricated by the method according to claim 1.

12. A method for fabricating an organic thin film transistor including a substrate, a gate electrode, a gate insulating layer, metal oxide source/drain electrodes and an organic semiconductor layer, the method comprising:
    treating at least one surface of the metal oxide source/drain electrodes with a self-assembled monolayer (SAM) forming compound containing a sulfonic acid group,
    wherein the self-assembled monolayer forming compound contains a sulfonic acid group and a fluorine atom and is selected from the group consisting of $CF_3(CF_2)_jSO_3H$, $CF_3(CH_2)_jSO_3H$, $CF_3(CF_2)_j(CH_2)_kSO_3H$, and $CH_3(CF_2)_j(CH_2)_kSO_3H$, wherein j and k are each independently an integer of from 1 to about 20.

13. A method for fabricating an organic thin film transistor including a substrate, a gate electrode, a gate insulating layer, metal oxide source/drain electrodes and an organic semiconductor layer, the method comprising:
    treating at least one surface of the metal oxide source/drain electrodes with a self-assembled monolayer (SAM) forming compound containing a sulfonic acid group,
    wherein the self-assembled monolayer forming compound containing a sulfonic acid group is represented by Formula 3 below:

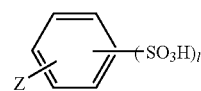

(3)

wherein
l is an integer from 1 to about 5, and
Z is hydrogen, fluorine, a $C_6$-$C_{30}$ aromatic group, or a $C_5$-$C_{30}$ heteroaromatic group in which the aromatic and heteroaromatic groups may be substituted with at least one group selected from the group consisting of a $C_1$-$C_{12}$ alkyl group, an alkoxy group, an ester group, a carboxylic group, a thiol group and an amine group,
wherein the self-assembled monolayer forming compound contains a sulfonic acid group and a fluorine atom and is further represented by either of Formulae 8 or 9:

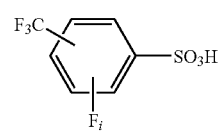

(8)

wherein i is an integer from 1 to about 4;

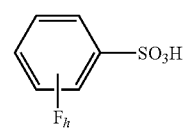

(9)

wherein h is an integer from 1 to about 5.

14. A method for fabricating an organic thin film transistor including a substrate, a gate electrode, a gate insulating layer, metal oxide source/drain electrodes and an organic semiconductor layer, the method comprising:
    treating at least one surface of the metal oxide source/drain electrodes with a self-assembled monolayer (SAM) forming compound containing a sulfonic acid group; and
    acid-treating or UV-ozonating the at least one surface of the source/drain electrodes prior to treating the at least one surface of the source/drain electrodes with the self-assembled monolayer forming compound containing a sulfonic acid group.

15. The method according to claim 14, wherein the acid treatment is performed by impregnating the at least one surface of the metal oxide source/drain electrodes with an organic or inorganic acid solution at a temperature from about 15 to about 35° C. for a time from about 0.5 to about 10 seconds.

16. The method according to claim 14, wherein the UV ozonation is performed by irradiating the at least one surface of the metal oxide source/drain electrodes using a lamp having a power of about 0.28 W/cm$^3$ at a wavelength of about 254 nm for about 1 to about 30 minutes.

17. The method according to claim 14, further including:
    annealing after treating the at least one surface of the source/drain electrodes with the self-assembled monolayer forming compound containing a sulfonic acid group.

18. The method according to claim 17, wherein the annealing is performed at a temperature from about 50 to about 200° C. for a time from about 10 minutes to about one hour.

19. An organic thin film transistor fabricated by the method of claim 17.

20. A display device comprising the organic thin film transistor of claim 19.

21. An organic thin film transistor fabricated by the method of claim 14.

22. A display device comprising the organic thin film transistor of claim 21.

23. A method for fabricating an organic thin film transistor including a substrate, a gate electrode, a gate insulating layer, metal oxide source/drain electrodes and an organic semiconductor layer, the method comprising:

treating at least one surface of the metal oxide source/drain electrodes with a self-assembled monolayer (SAM) forming compound containing a sulfonic acid group; and annealing after treating the at least one surface of the source/drain electrodes with the self-assembled monolayer forming compound.

24. The method according to claim 23, wherein the annealing is performed at a temperature from about 50 to about 200° C. for a time from about 10 minutes to about one hour.

25. An organic thin film transistor fabricated by the method of claim 23.

26. A display device comprising the organic thin film transistor of claim 25.

* * * * *